United States Patent
Sakai et al.

(10) Patent No.: US 6,912,123 B2
(45) Date of Patent: Jun. 28, 2005

(54) POWER SUPPLY DEVICE

(75) Inventors: Setsuo Sakai, Amagasaki (JP); Naoki Yamamoto, Amagasaki (JP); Tsurayoshi Imanishi, Amagasaki (JP)

(73) Assignee: Nipron Co., Ltd., Osaka (JP)

( * ) Notice: Subject to any disclaimer, the term of this patent is extended or adjusted under 35 U.S.C. 154(b) by 111 days.

(21) Appl. No.: 10/657,717

(22) Filed: Sep. 9, 2003

(65) Prior Publication Data

US 2005/0052164 A1 Mar. 10, 2005

(51) Int. Cl.[7] .............................. G06F 1/16; H02J 9/00
(52) U.S. Cl. ...................... 361/683; 361/752; 307/64; 307/66; 363/17
(58) Field of Search ................................ 361/683, 727, 361/752, 724; 307/64, 66, 150, 72–75, 82

(56) References Cited

U.S. PATENT DOCUMENTS

| | | | | |
|---|---|---|---|---|
| 5,438,497 A | * | 8/1995 | Jain | 363/17 |
| 5,604,405 A | * | 2/1997 | Ogura | 315/39.51 |
| 6,381,156 B1 | * | 4/2002 | Sakai et al. | 363/65 |
| 6,496,394 B2 | * | 12/2002 | Hanaoka et al. | 363/71 |
| 6,522,150 B2 | * | 2/2003 | Fujita | 324/455 |

\* cited by examiner

*Primary Examiner*—Rajnikant B. Patel
(74) *Attorney, Agent, or Firm*—Armstrong, Kratz, Quintos, Hanson & Brooks, LLP

(57) ABSTRACT

An object of the present invention is to provide a power supply device that permits high efficiency and miniaturization, that makes the constitution of a power supply device advantageous from a cost perspective and an assembly work standpoint, and that also allows the cooling fan to be changed rapidly. A protective member H is mounted so as to be displaceable to a removal disabling position in which the protective member H obstructs the removal of the cooling fan F by abutting against the cooling fan F, and to a removal enabling position that permits removal of the cooling fan F. Stopper members, which serve to obstruct movement of the protective member H to the removal disabling position by abutting against the protective member H in a state where the cooling fan F is not disposed in a predetermined position, are provided.

6 Claims, 13 Drawing Sheets

(a)

(b)

(a)

(b)

(a)

(b)

(a)

(b)

(a)

(b)

POWER SUPPLY DEVICE

BACKGROUND OF THE INVENTION

1. Field of the Invention

The present invention relates to a power supply device that can easily and rapidly constitute an uninterruptible redundant power supply device capable of driving a load by means of a rectified output from a commercial alternating current (AC) power supply during normal operation and driving the load by means of an output from a secondary cell or other DC power supply during abnormal operation such as during a power outage, for example. More particularly, the present invention relates to a power supply device that can be converted into an uninterruptible redundant power supply device that is used in order to operate highly important devices such as precision instruments and automated machineries which are directed toward crime prevention, disaster prevention, communications, information (server computers, FA personal computers, and so forth), and medical care. Here, a power outage indicates that the electrical power (current) supply is disconnected, and indicates cases where the supply of power from an electric power company is cut, and cases where the power supply is cut due to the failure of a breaker, a plug being disconnected, or a wire break, and so forth, for example.

2. Description of the Related Art

Although there is a need for uninterruptible redundant power supply devices because of the requirement for continuous uninterrupted operation over a 5-year duration 24 hours a day, or similar, when the above-mentioned power supply device is used for a server computer or similar, for example, the need for uninterruptible redundant power supply devices is low due to the problem of the steep rise in costs of computers used by individuals (personal computers). However, the present state of affairs is that, in addition to users requiring low-cost power supply devices that can be used only when commercial AC power supplies are working normally, that is, ordinarily, uninterruptible redundant power supply devices that permit devices to be employed even during abnormal operation such as during a power outage are required, and therefore two types of power supply devices are manufactured.

Furthermore, there is sometimes a need for a power supply device that differs from an uninterruptible redundant power supply device capable of dealing with a power outage, that is, a power supply device embedded with an output terminal for outputting a desired voltage, and hence, in addition to the two above-mentioned types of power supply device, a total of three or more types of power supply device are manufactured.

Further, the above-mentioned power supply devices are equipped with a cooling fan serving to release warm air within the device to the outside so as to avoid a drop in efficiency caused by heat. This cooling fan has a lifespan and must therefore be changed. Therefore, conventionally, a power supply device constituted such that the power supply connector of the cooling fan is removed to stop the drive of the cooling fan at the same time the cooling fan is removed has been proposed.

In cases where three or more other types of power supply device are manufactured as described above, not only is there an increase in the manufacturing costs, the post-production warehousing costs rise as the number of device types increases.

Furthermore, uninterruptible redundant power supply devices such as the one shown in FIG. 6, for example, are known from the prior art. This device comprises a primary side drive circuit A, which is constituted by a rectifier circuit 4 connected to a commercial AC power supply 1, an active filter circuit 5, and a switching element 8 and gate circuit 7 for supplying a voltage to a secondary side drive circuit B via a high frequency transformer 2; a secondary cell 3, which is constituted by a battery and so forth connected to the secondary side drive circuit B; and three DC-DC converters 50 that are connected in parallel with the single secondary side drive circuit B in order to permit a voltage step down by reducing the DC voltages of three different magnitudes for the load 14. 11 in the drawings is a rectifier diode, 12 is a smoothing choke coil, and 13 is a smoothing capacitor.

According to the above constitution, based on a relationship in which the secondary cell 3 and the three DC-DC converters 50 and so forth are connected to the single secondary side drive circuit B, not only is the secondary side drive circuit B then large and complex, when the DC-DC converters 50 fail, there is also the disadvantage that a DC voltage at a given point that is output via the DC-DC converters 50 cannot be extracted even during normal (ordinary) operation.

Furthermore, because the DC-DC converters 50 are interposed, there is the disadvantage that a total efficiency of approximately 55 to 64%, which is yielded by multiplying the efficiency of 75 to 80% of the secondary side DC-DC converters 50 by the efficiency of 75 to 80% of the primary side switching power supply circuit, is produced, and hence energy loss is a problem.

Further, when the cooling fan provided in the power supply device is changed, because the constitution is one in which the drive of the cooling fan is stopped by completely removing the cooling fan, injuries result when the cooling fan is being removed and a finger mistakenly strikes the rotating fan blades of the cooling fan during operation thereof. Further, although it may be assumed that care is taken in removing the cooling fan in order to avoid injury, because a large amount of time and effort is required in the operation to change the cooling fan, there is a margin for improvement.

SUMMARY OF THE INVENTION

Accordingly, the present invention was conceived in view of the above situation, an object of the present invention being to provide a power supply device that permits high efficiency and miniaturization, that makes constituting a power supply device equipped with a variety of functions advantageous from a cost perspective as well as from an assembly work standpoint, and that also allows the cooling fan to be changed rapidly with no injury concerns.

In order to resolve the above problem, the power supply device according to the present invention is a power supply device, wherein: a power supply circuit, which comprises a rectifier circuit for rectifying an AC current from a commercial AC power supply and a switching element provided on the output side of the rectifier circuit, is connected to a first primary side winding of a high frequency transformer; a secondary side DC output circuit, which supplies electric power to a load, is connected to a secondary side winding of the high frequency transformer; a second primary side winding of the high frequency transformer and a DC power supply circuit that is separate from the power supply circuit are provided with connecting portions that are capable of connecting and disconnecting the second primary side winding and the DC power supply circuit; a cooling fan for the release to the outside of heat generated within a casing that houses at least the power supply circuit, the first primary side winding, the secondary side DC output circuit, the secondary side winding, and the second primary side winding is detachably mounted in the casing; a protective member is mounted so as to be displaceable to a removal disabling position located in front of the cooling fan in order to obstruct removal of the cooling fan by abutting against same, and to a removal enabling position that is retracted from the position in front of the cooling fan in order to allow removal of the cooling fan; the protective member is constituted so as to be displaceable to the removal enabling position only when a switch provided on the casing is turned OFF in order to switch the cooling fan from ON to OFF, or only when an insertable/removable power supply cable plug that is inserted in an input portion provided in the casing in order to input the AC current from the commercial AC power supply is removed, or only when the switch is turned OFF and the plug is removed; a stopper member, which obstructs the movement of the protective member to the removal disabling position by abutting against the protective member in a state where the cooling fan is not disposed in a predetermined position in the casing, and which allows the movement of the protective member to the removal disabling position in a state where the cooling fan is disposed in the predetermined position in the casing, is provided.

As described above, because the power supply circuit, to which the commercial AC power supply is applied and which is connected to the first primary side winding, the secondary side DC output circuit, and the DC power supply circuit, which is connected to the second primary side winding, are each connected so as to be electrically completely isolated via the high frequency transformer, the circuits can be simplified. Furthermore, because the DC power supply circuit, to which a battery or other secondary cell is connected, is provided on the primary side, the secondary side output voltage can be changed simply by changing the winding number of the secondary side winding with respect to the high frequency transformer, and therefore the formation of a different output voltage by connecting a step-down voltage circuit constituted by a plurality of DC-DC converters and so forth to a single secondary side drive circuit as per the prior art is no longer necessary. Moreover, because the second primary side winding and a DC power supply circuit separate from the power supply circuit are provided with connecting portions that are capable of connecting and disconnecting the second primary side winding and the DC power supply circuit, an uninterruptible redundant power supply device can be constituted simply by connecting various DC power supply circuits constituted as per requirements to the connecting portion of the second primary side winding, and a desired power supply device, which constitutes a power supply device capable of outputting another output voltage of a different magnitude to the secondary side, can be obtained simply by connecting the various DC power supply circuits as required to a common AC drive unit.

Moreover, when the cooling fan is changed, after the drive of the cooling fan is completely stopped by turning OFF the cooling fan ON-OFF switch, or removing the insertable/removable power supply cable plug to disconnect the AC current from the commercial AC power supply, or by doing both, that is, turning the switch OFF and removing the plug, the protective member can be displaced to the removal enabling position. In other words, before the cooling fan is removed, the party performing the work is able to personally recognize that the drive of the cooling fan is stopped by deliberately turning OFF the cooling fan ON-OFF switch or deliberately removing the insertable/removable power supply cable plug, and is then able to immediately proceed with the work of changing the cooling fan. Further, the cooling fan can be removed by displacing the protective member to the removal enabling position. In addition, if, after the cooling fan has been removed, the new cooling fan is not disposed in a predetermined position in the casing, the stopper member is able to obstruct the displacement of the protective member to the removal disabling position by abutting against the protective member. When the protective member is not in the removal disabling position (when the protective member is in the removal enabling position), the switch cannot be turned ON. It is therefore possible to avoid trouble arising from the damage to the circuit constituent parts that is caused by the heat generated by operating the power supply device when the installation of the cooling fan has been forgotten.

The power supply device according to the present invention is a power supply device, wherein: a fan cover for covering the cooling fan is detachably provided in the casing, in front of the cooling fan; and a second stopper member, which serves to obstruct the movement of the protective member to the removal disabling position by abutting against the protective member in a state where the fan cover is not disposed in a predetermined position of the casing, and which serves to allow the movement of the protective member to the removal disabling position in a state where the cooling fan is disposed in the predetermined position in the casing, is provided.

As described above, it is possible to allow the protective member to move to the removal disabling position only when the fan cover, like the cooling fan, is disposed in a predetermined position of the casing, it is possible to avoid the power supply device being operated when the installation of the fan cover has been forgotten and avoid a finger being caught in and damaged by the cooling fan during operation thereof. Further, if the stopper member for the cooling fan and the second stopper member for the fan cover are constituted by a single integral member, the device is also advantageous from an assembly work standpoint, as well as an inventory management perspective on account of the reduced number of parts.

The power supply device according to the present invention is a power supply device, further comprising: a first thermal radiation fin for releasing heat generated by circuit constituent parts of the power supply circuit and the secondary side DC output circuit; and a second thermal radiation fin for releasing heat generated by circuit constituent parts of the DC power supply circuit, wherein the two thermal radiation fins are brought into a thermally conductive state by being made to contact each other, whereby the thermal radiation area can be increased rapidly. More particularly, in the case of an uninterruptible redundant power supply device, because electric current does not flow in the DC power supply circuit in a state where the secondary side DC output circuit is driven by the power supply circuit, the unused second thermal radiation fin of the DC power supply circuit can be effectively used as a thermal radiation fin for releasing heat generated by constituent parts of the power supply circuit. Further, also when a power supply device capable of outputting another output voltage of a different magnitude to the secondary side is constituted, in a state where the other output voltage is not used, the unused second thermal radiation fin can be used as a thermal radiation fin for releasing heat generated by the constituent parts of the power supply circuit as per the above-mentioned case of the uninterruptible redundant power supply device. Further, when an uninterruptible redundant power supply device is constituted, there is the advantage that, even when there is a breakdown caused by a surge in a thunderstorm or by a variety of impulse surges, and so forth, the load can be continuously driven without being stopped because electric power is supplied instantly by the DC power supply circuit. The switching element for the DC power supply circuit is switched from an idle or OFF (stopped) state to an active state when the voltage of the power supply circuit drops below a predetermined voltage or is zero. Idle signifies a state where current does not flow although the switching element is repeatedly turned ON-OFF in sync with the switching element of the AC power supply circuit.

The DC power supply circuit comprises a switching element that is in sync with a switching element of the power supply circuit or that is operated in accordance with the operating states of the power supply circuit.

The power supply device according to the present invention is a power supply device, wherein: an AC drive unit is constituted by the power supply circuit, the first primary side winding, the secondary side DC output circuit, the secondary side winding, the second primary side winding, and the first thermal radiation fin; the AC drive unit is housed in the casing; a DC power supply circuit unit is constituted by the DC power supply circuit and the second thermal radiation fin; the DC power supply circuit unit is housed in an auxiliary casing that is different from the casing; air guide holes, which serve to allow air inside the auxiliary casing to be transferred to the casing by means of the cooling fan, are formed in the auxiliary casing and the casing, whereby the internal temperature can be efficiently lowered not only in the casing but also in the auxiliary casing by means of a single cooling fan.

Because the circuit constituent parts are a diode and the switching element that generate a relatively large amount of heat, heat can be efficiently radiated.

BRIEF DESCRIPTION OF THE DRAWINGS

FIG. 2(a) is a planar view thereof, FIG. 2(b) is a side view thereof, and FIG. 2(c) is a front view thereof as seen from the auxiliary casing side;

FIG. 5(a) is a cross-sectional view of the casing showing the shape of the first thermal radiation fin, and FIG. 5(b) is a cross-sectional view of the casing showing the shape of the second thermal radiation fin;

FIG. 6(a) shows a state in which a protective member is positioned in front of the cooling fan, and FIG. 6(b) shows a state in which the protective member is retracted from a position in front of the cooling fan;

FIG. 7(a) shows a state in which a protective member is positioned in front of the cooling fan, and FIG. 7(b) shows a state in which the protective member is retracted from a position in front of the cooling fan;

FIG. 10(a) is a cross section through the upper stopper member and FIG. 10(b) is a cross section through the lower stopper member;

FIG. 11(a) shows a state in which movement toward the removal disabling position is obstructed by means of the upper stopper member, and FIG. 11(b) shows a state in which movement toward the removal disabling position is obstructed by means of the lower stopper member;

DESCRIPTION OF THE PREFERRED EMBODIMENTS

Figure 1:
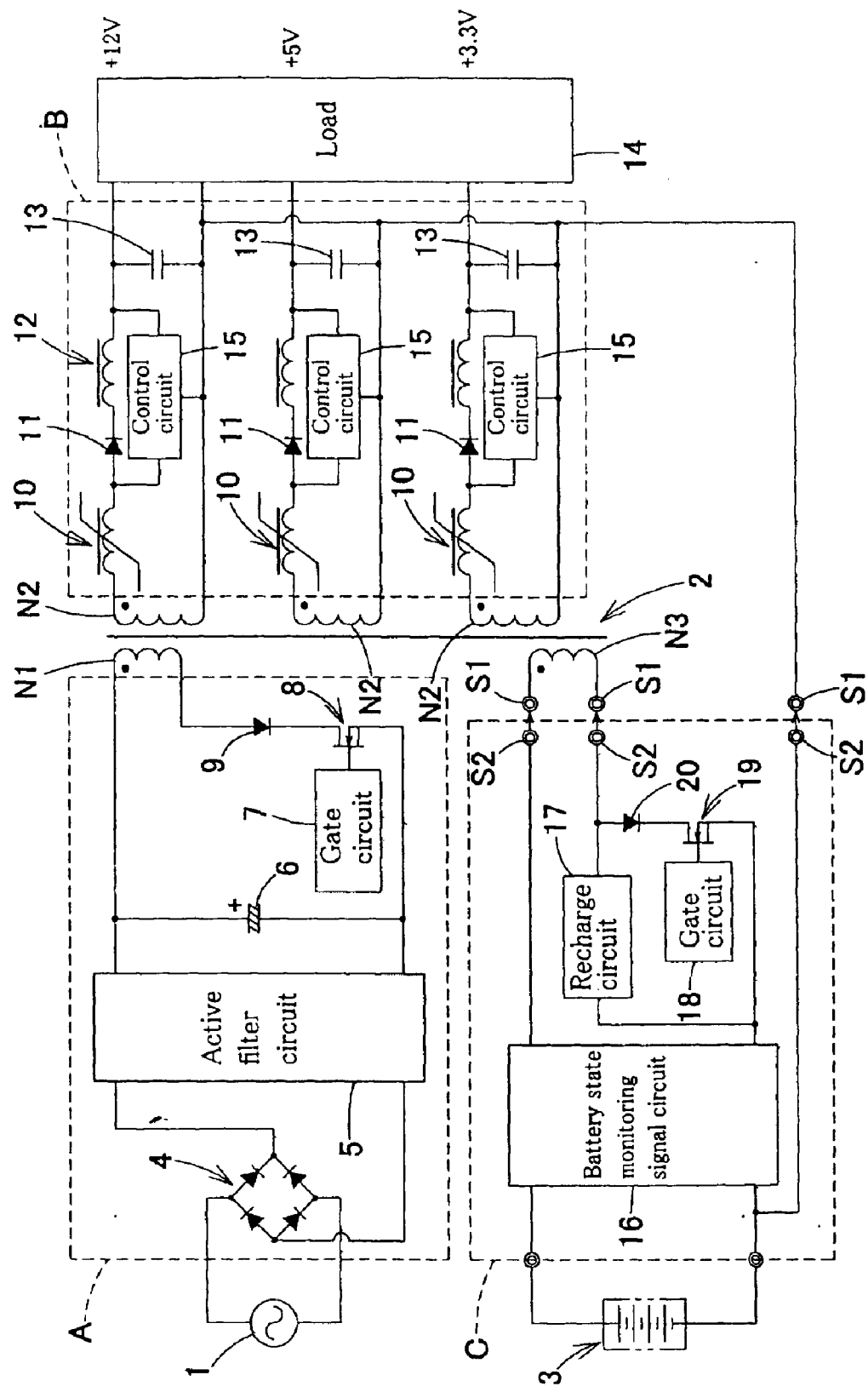
FIG. 1 shows an outline block diagram constituting an uninterruptible redundant power supply device.

FIG. 1 shows a forward-type uninterruptible redundant power supply device. This uninterruptible redundant power supply device is constituted by a power supply circuit A for rectifying an AC current from a commercial AC power supply 1 and outputting the rectified current to a first primary side winding N1 of a high frequency transformer 2; a secondary side DC output circuit B, which is connected to secondary side windings N2 of the high frequency transformer 2 so as to be electrically isolated therefrom and serves to supply DC electric power to a load 8; and a DC power supply circuit C, which supplies electric power to the secondary side DC output circuit B by means of the output of a secondary cell (called the "battery" hereinafter) 3 in accordance with the operational state of the power supply circuit A to a second primary side winding N3 of the high frequency transformer 2. A nickel hydrogen cell, lithium cell, lead cell or NiCad cell may be used as the battery 3. Further, redundant power supply device types include the flyback-type, full-bridge-type, and half-bridge-type in addition to the forward-type, any of which may serve as the redundant power supply device.

The main constituent parts of the power supply circuit A are a rectifier circuit 4 for rectifying the AC current from the commercial AC current power supply 1; an active filter circuit (may be omitted) 5, which is a harmonic current prevention circuit; a smoothing capacitor 6 for the accumulation of a DC voltage from the active filter circuit 5; an FET 8 constituting a switching element that is operated by a gate signal from the gate circuit 7 and connected to the first primary side winding N1 of the high frequency transformer 2; and a countercurrent-preventing diode 9 constituting means for preventing the backflow of an overcurrent caused by an induced voltage from the DC power supply circuit C to the power supply circuit A. However, other constitutions are also acceptable.

The above-mentioned secondary side DC output circuit B is composed of three closed loops so that three types of DC output voltages (in FIG. 1, these voltages are 12V, 5V, and 3.3 V in order from the top, but any voltage values may be set) can be output to the load 14. The input sides of the three closed loops are respectively connected to three secondary side windings N2 each having a different winding number (although there are three here, the quantity may be one, two or four or more) so that the three types of DC output voltages can be output from the output sides of the three closed loops. Each closed loop is composed of the magnetic amplifiers 10, rectifier diodes 11, smoothing coils 12, smoothing capacitors 13, and control circuits 15 for controlling the ON interval of magnetic amplifiers 10. Although the provision of these magnetic amplifiers 10 and control circuits 15 is advantageous in that fixed voltages can be output to the load 14, the secondary side DC output circuit B may be implemented without the magnetic amplifiers 10 and control circuits 15.

The DC power supply circuit C is constituted by a battery state monitoring signal circuit 16 for monitoring the state of the battery 3; a recharge circuit 17 for recharging the battery 3; an FET 19 constituting a switching element that is operated by a gate signal from a gate circuit 18 and connected to the second primary side winding N3 of the high frequency transformer 2; and a countercurrent-preventing diode 20 constituting means for preventing the backflow of an overcurrent caused by an induced voltage from the power supply circuit A to the DC power supply circuit C. However, other constitutions are also acceptable. The battery state monitoring signal circuit 16 is provided in order to detect whether the battery 3 is in a recharging state or a discharging state, to output a control signal in order to perform recharge control or discharge control for the battery 3 in accordance with the signal thus output, to output a signal to terminate discharge from the battery 3 because a voltage drop state of the battery 3 is detected and a discharge termination voltage has been reached, to output a control signal in order to drive or terminate the DC power supply circuit C upon receiving an outage detection signal or outage recovery signal, and to exchange various signals.

The redundant power supply device of this constitution may be constituted such that a control signal is always output by a control circuit (not shown) to the two gate circuits 7 and 18, for example, so as to synchronize the two switching elements 8 and 19 or may be constituted such that, when the commercial AC power supply 1 is normal, the switching element 8 of the power supply circuit A is set to an active state, and the switching element 19 of the DC power supply circuit C is set to an idle or OFF state in sync with the switching element 8, and, when the voltage from the commercial AC power supply 1 is abnormal, having dropped below a predetermined voltage, the opposite is true, i.e. the switching element 8 of the power supply circuit A is set to an idle or OFF state in sync with the switching element 19 of the DC power supply circuit C and the switching element 19 of the DC power supply circuit C is set to an active state, and so forth, so that the switching elements may be operated in accordance with the operational states of the power supply circuit A. Here, although a redundant power supply device constituted such that a DC voltage is output from the DC power supply circuit C to the secondary side DC output circuit B when the output from the power supply circuit A during an outage and so forth is broken is illustrated, the power supply device may be constituted having another power supply circuit that makes it possible to output a voltage of 24V, for example.

Figure 2:
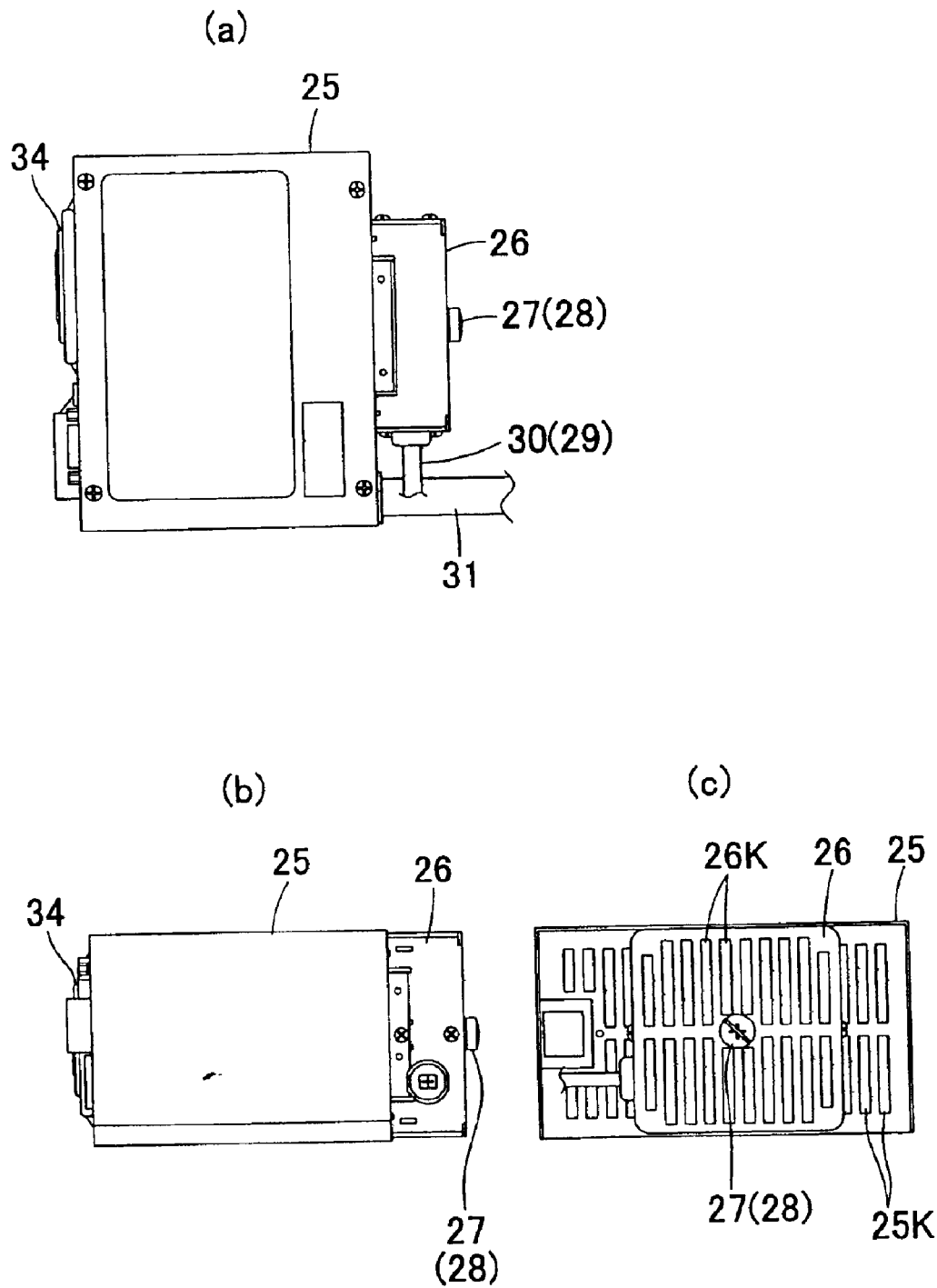
FIG. 2 shows an outside view of an uninterruptible redundant power supply device in which the casing and auxiliary casing are integrated, where
Figure 3:
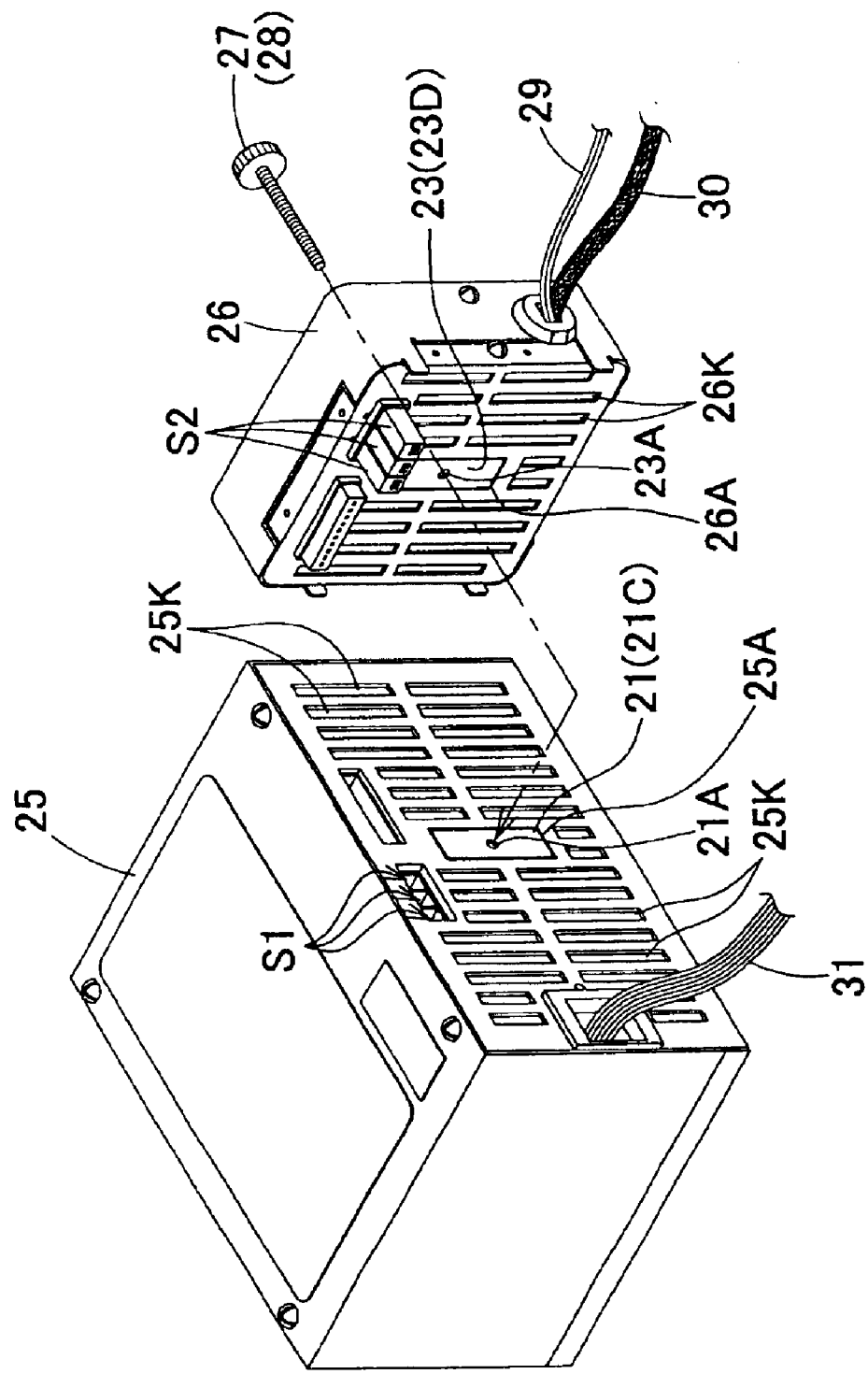
FIG. 3 is an exploded perspective view showing the state immediately before the auxiliary casing is integrated with the casing.
Figure 4:
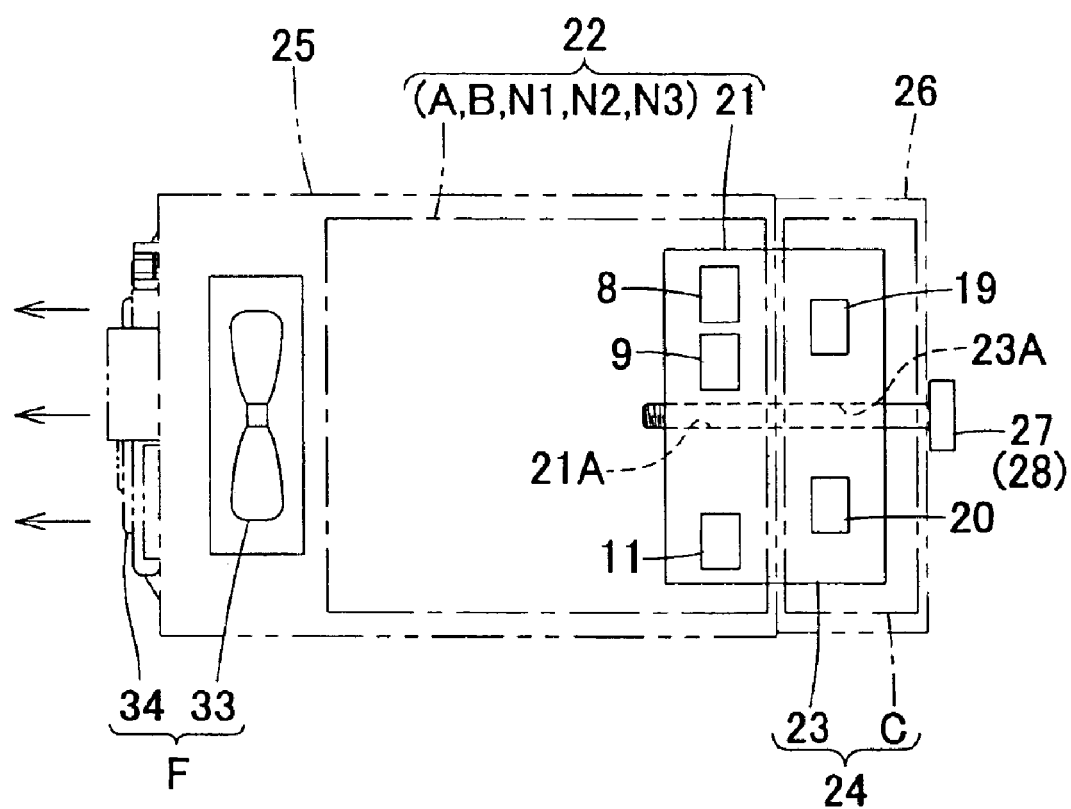
FIG. 4 is an outline explanatory view showing the constitution within the two integrated casings.

As shown in FIGS. 1, 3, and 4, an AC drive unit 22 is constituted by the power supply circuit A, the first primary side winding N1, the secondary side DC output circuit B, the secondary side windings N2, the second primary side winding N3, and a first thermal radiation fin 21 for releasing heat generated by the diodes 9 and 11 and the FET 8 that are power supply circuit constituent parts; the AC drive unit 22 is housed within a casing 25 and part of the first thermal radiation fin 21 is exposed to the outside via a hole 25A formed in the casing 25; the DC power supply circuit unit 24 is constituted by the DC power supply circuit C and a second thermal radiation fin 23 for releasing the heat generated by the FET 19 and countercurrent-preventing diode 20 that are DC power supply circuit constituent parts, and so forth; the DC power supply circuit unit 24 is housed within an auxiliary casing 26 and part of the second thermal radiation fin 23 is exposed to the outside via a hole 26A formed in the auxiliary casing 26; and the second primary side winding N3 and the DC power supply circuit C are provided with male- and female-type connecting portions S1 and S2 that are capable of connecting and disconnecting the second primary side winding N3 and the DC power supply circuit C, and thermal conduction means 28 are constituted by a screw 27 constituting joining means for pulling the two casings 25 and 26 in the direction in which the casings 25 and 26 approach each other and for securing direct contact between the two thermal radiation fins 21 and 23 exposed to the outside. Exposure signifies a state of being open to the outside. Protrusion may be from the casing 25 or 26, may be a state of a surface with respect to the casings 25 and 26 or may be a sunken state in the casings 25 and 26. More specifically, by inserting the screw 27 in the through-hole (not shown) formed in the auxiliary casing 26 and the through-hole 23A formed in the second thermal radiation fin 23 and then screwing the screw 27 into the screw hole 21A formed in the first thermal radiation fin 21, it is possible to maintain a state of contact between the two thermal radiation fins 21 and 23, and, at the same time, the casings 25 and 26 can be integrated as shown in FIGS. 2(a), 2(b), and 2(c). At such time, the male-type connecting portion S2 is fitted with the female-type connecting portion S1 such that the connecting portions S1 and S2 are connected to each other. Further, the connecting portions S1 and S2 are constituted by three terminals, namely two terminals for connecting the second primary side winding N3 and the DC power supply circuit C to establish a closed loop circuit, and an earth terminal for the withdrawal of a ground line. Although one screw 27 is employed in the drawings, lines 21 and 23 may be made to contact one another more reliably by means of two or more screws. Further, in place of the screw 27, the casings 25 and 26 can also be constituted each comprising a latching part and latched part that serve to latch the casings 25 and 26 together in an integrated state. In this case, there is the advantage that the operation to integrate the casings 25 and 26 can be undertaken rapidly in comparison with the case where a screw is employed. Furthermore, although there is the advantage that it is possible to suppress a drop in the thermal conduction efficiency by bringing the two thermal radiation fins 21 and 23 into direct contact, the two thermal radiation fins 21 and 23 can also be made to enter a thermally conductive state through the interposition of the casings 25 and 26. In this case, the casings 25 and 26 are preferably made from a highly thermally conductive metal such as aluminum. 29 shown in FIG. 3 is an electrical wire for a connection with the battery 3, and 30 is a signal wire for inputting/outputting various signals. Further, 31 are electrical wires for a connection with the commercial AC power supply and electrical wires for inputting/outputting various signals. Here, although the description is for a constitution in which the circuits are covered by the casings 25 and 26, a constitution excluding the casings 25 and 26 is also possible.

As described above, because the two thermal radiation fins 21 and 23 are in contact with each other, when the commercial AC power supply 1 is in a normal state and only the power supply circuit A is driven to drive the secondary side DC output circuit B, the unused second thermal radiation fin 23 can be effectively used in addition to the first thermal radiation fin 21 to efficiently release the heat generated by the diodes 9 and 11 and the FET 8, and, when the commercial AC power supply 1 is in an abnormal state and only the DC power supply circuit C is driven to drive the secondary side DC output circuit B, the unused first thermal radiation fin 21 can be used in addition to the second thermal radiation fin 23 to efficiently release the heat generated by the diode 20 and the FET 19.

Figure 5:
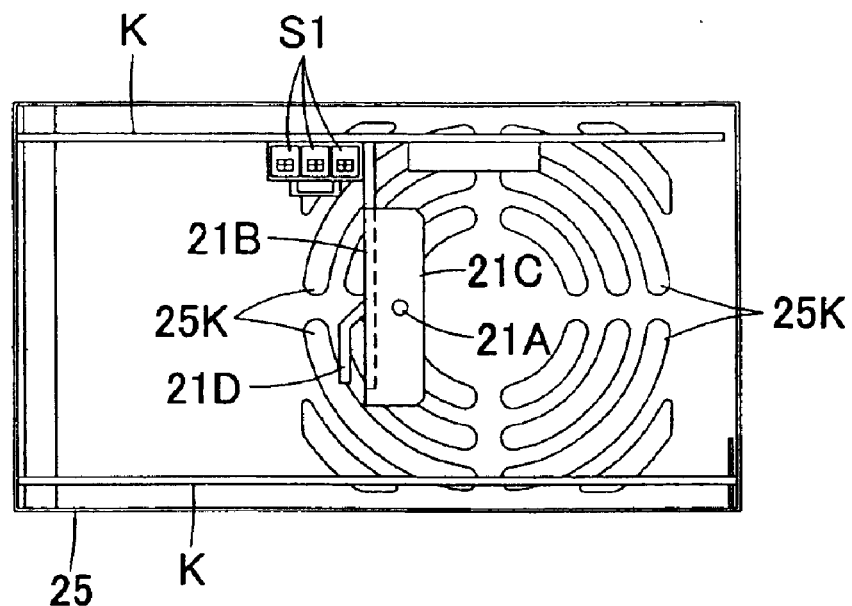
FIG. 5 shows the shape of the thermal radiation fin in the casing, where
Figure 5:
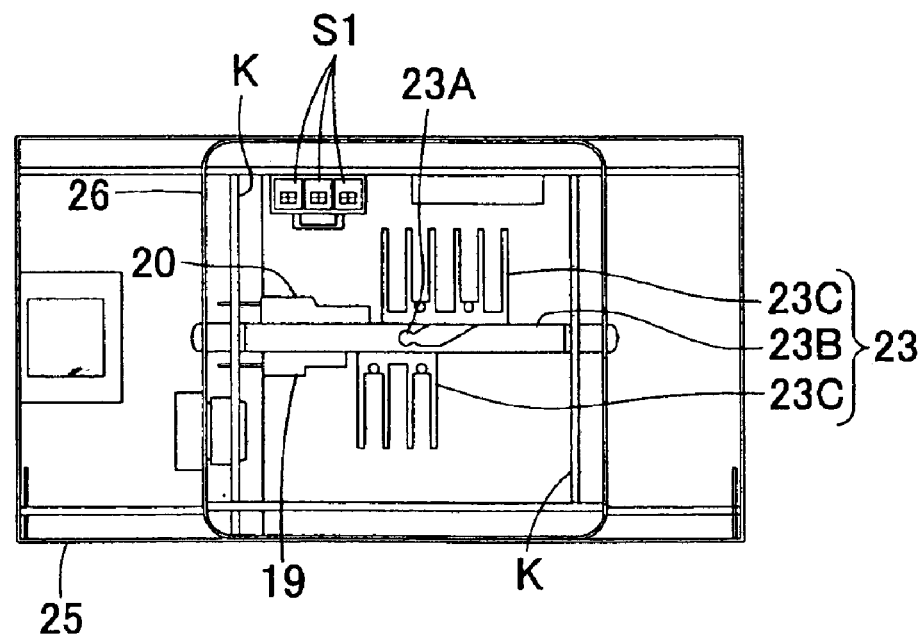

As shown in FIGS. 3 and 5(a), the first thermal radiation fin 21 is constituted by a main body portion 21B, which is fixed to the side of the casing 25 and which is mounted in a state in which the outer faces (not shown in the drawings) of the diodes 9 and 11 and the FET 8 are in contact; an extending portion 21C, which comprises the screw hole 21A, bends from the main body portion 21B, and is exposed to the outside via the casing 25; and a fin portion 21D that serves to enlarge the thermal radiation area. However, the shape of the first thermal radiation fin 21 could also be different to that shown in the drawings. Further, as shown in FIGS. 3 and 5(b), the second thermal radiation fin 23 is constituted by a main body portion 23B, which is fixed to the side of the auxiliary casing 26 and which is mounted in a state in which the outer faces of the diode 20 and the FET 19 are in contact; a plurality of auxiliary fin portions 23C which are mounted on the main body portion 23B and serve to enlarge the thermal radiation area; and an extending portion 23D, which is integrated with the main body portion 23B and extends so as to be exposed to the outside via the auxiliary casing 26 as detailed above. However, the shape of the second thermal radiation fin 23 could also be a different to that shown in the drawings. Although the separately formed main body portion 23B and the plurality of auxiliary fin portions 23C are integrated in FIG. 5(b), a single (one) structure made by integrally forming the main body portion and the auxiliary fin portions is also possible. K in FIGS. 5(a) and 5(b) is a printed circuit board for mounting conductors that constitute leg portions for circuit constituent parts such as the diode 20 and the switching element 19 and so forth.

Figure 6:
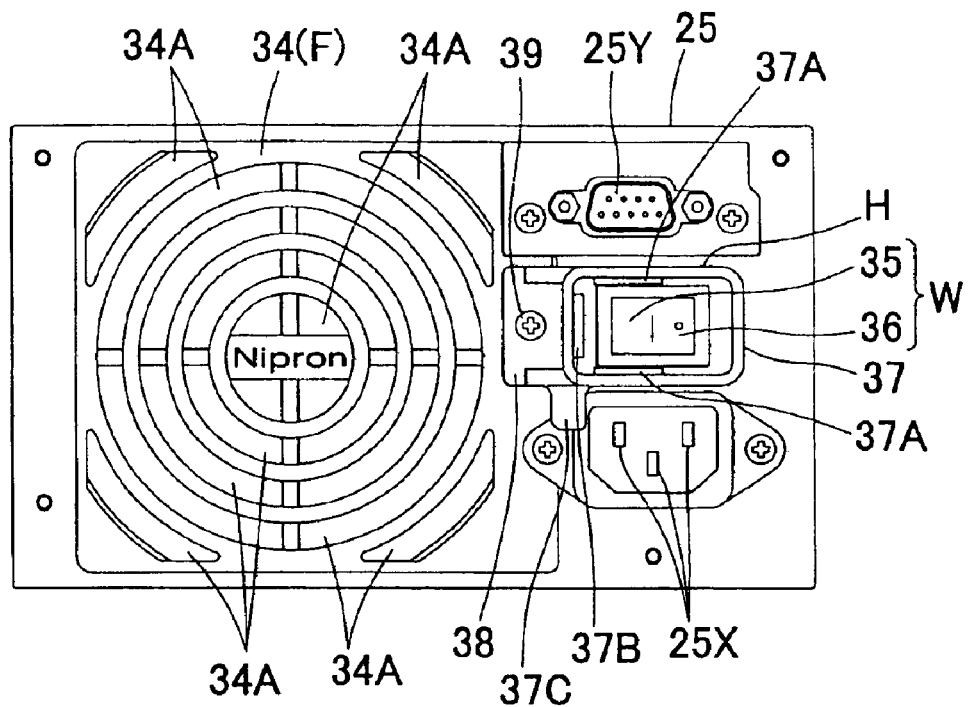
FIG. 6 is a rear view of the casing as viewed from the cooling fan side, where
Figure 6:
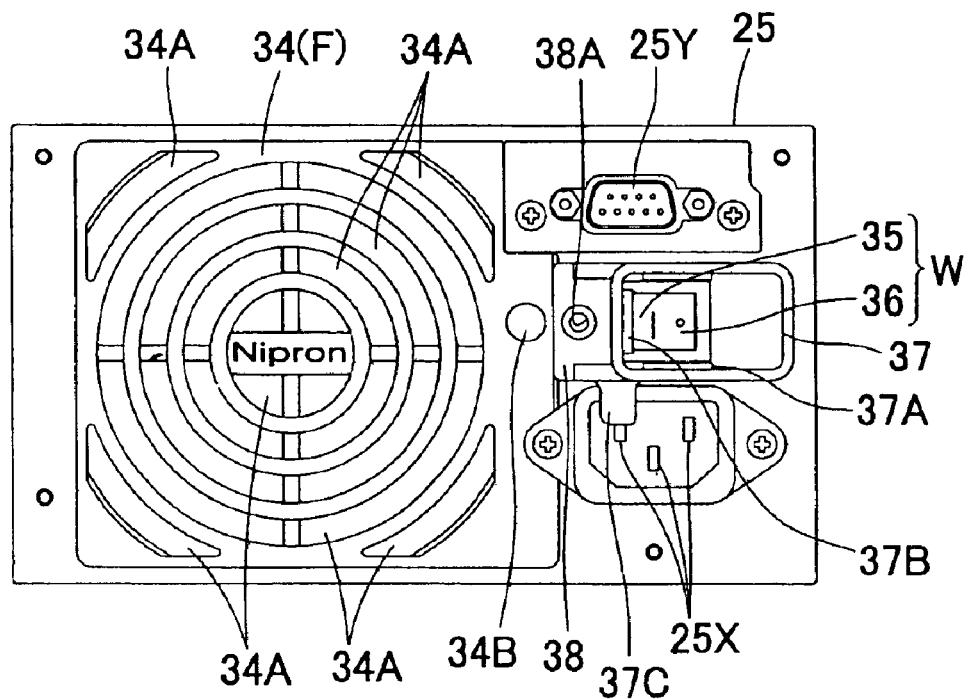
Figure 7:
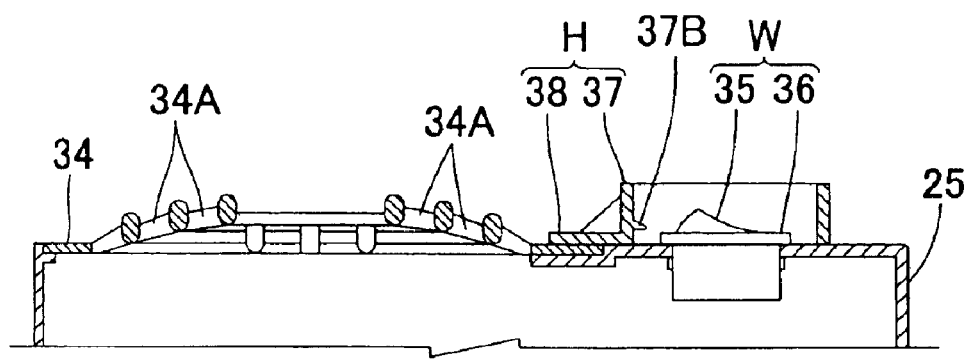
FIG. 7 shows a transverse planar view of the cooling fan attachment section, where
Figure 7:
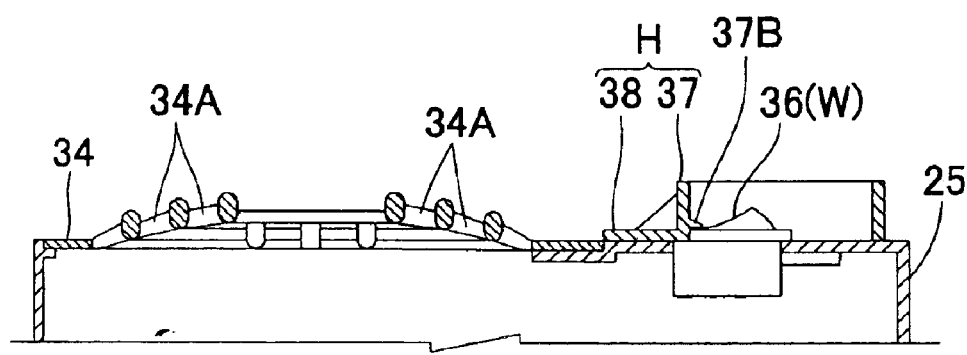
Figure 8:
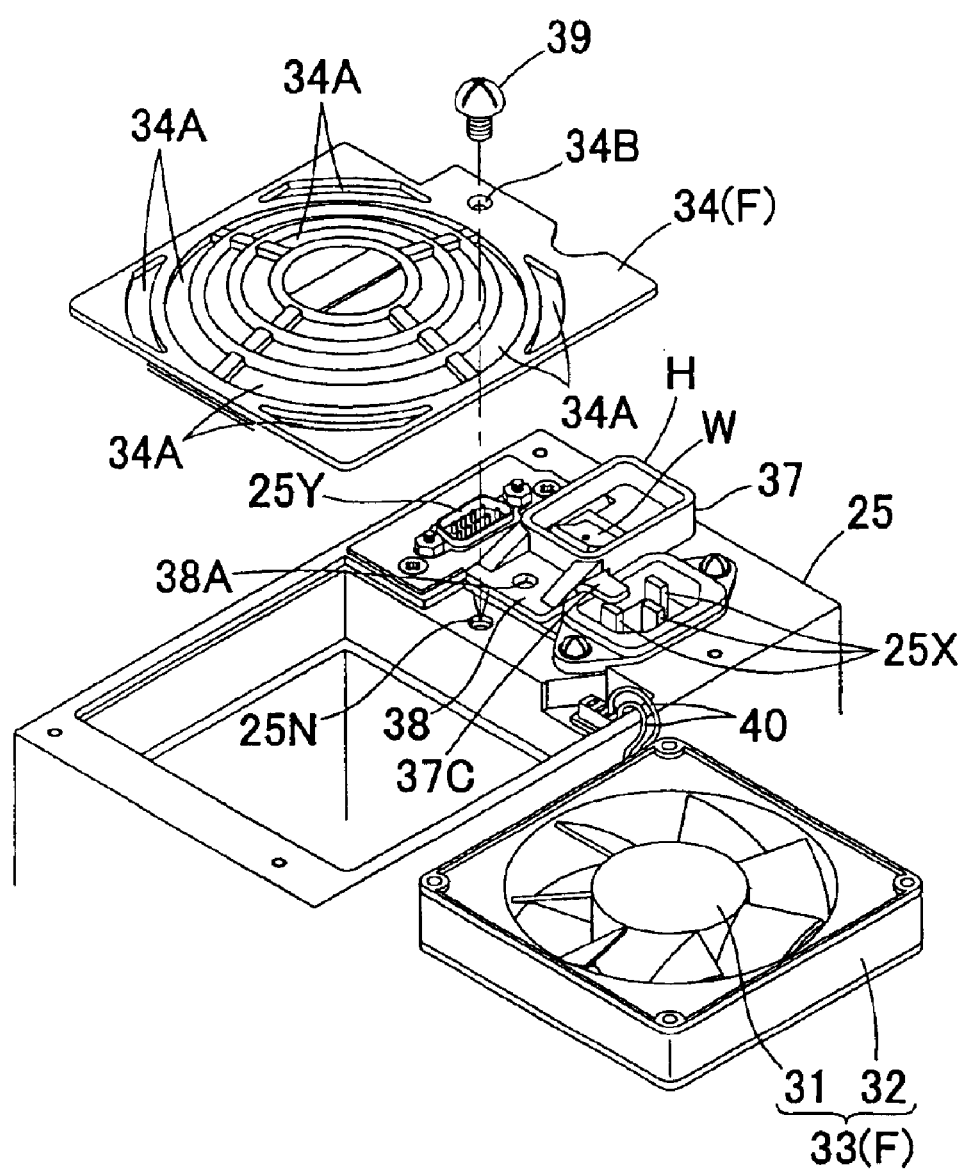
FIG. 8 is a perspective view of the main parts that shows a state in which the cooling fan has been removed.

As shown in FIGS. 6(a), 6(b) to FIG. 8, a cooling fan F for releasing heat generated within the casing 25 (heat generated by the circuits, heat generated by the circuit constituent parts, and heat released by the first thermal radiation fin 21) is detachably mounted to the end of the casing 25 on the side opposite the side where the auxiliary casing 26 is joined, and a slide member H constituting a protective member is mounted so as to be displaceable to a removal disabling position located in front of the cooling fan F in order to obstruct, through abutment, removal of the cooling fan F, and to a removal enabling position that is retracted from the position in front of the cooling fan F in order to allow removal of the cooling fan F. That is, a power supply switch W that serves to turn the cooling fan F ON and OFF by introducing the power supply to the circuits A, B, and C is swingably provided in the casing 25 such that only when the switch W is turned OFF, and the plug of a connectable power supply cable which the casing 25 comprises and is inserted in an input portion 25X with three connection points is removed, can the slide member H be changed to the removal enabling position. 25Y in FIGS. 6(a), 6(b), and 8 is a connector for extracting signals such as a signal that indicates an outage signal, a battery recharge state, and so forth, but this connector may be omitted. Although the protective member is constituted by a slidable slide member H, a rotatable protective member is also acceptable.

As shown in FIG. 8, the cooling fan F comprises a fan main body 33, which is constituted by a fan portion 31 equipped with a multiplicity of rotating fan blades and a substantially square-shaped (any shape is acceptable, such as an oblong or circular shape) frame body 32 for rotatably supporting the fan portion 31; and a plate-like fan cover 34 made of resin (could also be made of metal and so forth) for fixing the fan main body 33 so that same is fitted within the casing 25 in a state in which the outside of the fan main body 33 is covered. However, the fan cover 34 and frame body 32 could also be integrated, and the specific constitution of the cooling fan F can be changed freely. A multiplicity of openings 34A for releasing warm air drawn in by the fan portion 31 to the outside is formed in the fan cover 34.

In FIG. 7(a), the switch W is constituted as a swing-type switch that is capable of swinging on a vertical axial core substantially in the center in the longitudinal direction of the switch W and so that an ON-OFF action is permitted by tilting the switch W to a depressed position by pressing one of left and right operating parts 35 and 36 located on the left and right either side of the vertical axial core. However, any kind of switch is acceptable, such as a switch formed as a slide-type switch, a switch formed as a push button-type switch, or a toggle switch.

The slide member H is constituted such that a substantially oblong frame portion 37 that covers the outside of the switch W, and a stopper 38 that is located in front of the fan cover 34 and serves to obstruct, through abutment, the forward movement of the fan cover 34 are integrally formed by means of a composite resin. However, the specific constitution, such as the shape, can be changed freely. Further, of the left and right short sides of the frame portion 37, a protrusion 37B that protrudes toward the one short side is integrally formed with the inner face of the other short side next to the fan cover 34, such that, when the switch W is in an ON state, the protrusion 37B abuts against the left end face, of the left-hand side operating part 35 of the switch W, that protrudes forwards, whereby rightward sliding of the slide member H is obstructed, and, as shown in FIGS. 6(b) and 7(b), as a result of the switch W entering an OFF state, the slide member H is moved rightward such that the protrusion 37B is located in front of the left-hand side operating part 35 of the switch W, whereby obstruction through abutment is permitted so that an ON operation of the switch W is not possible. Further, a plate-like protrusion 37C that protrudes downward is formed integrally with the lower end of the slide member H such that the inserted plug of the power supply cable cannot be removed from the input portion 25X, the slide member H cannot be slid toward the right, and a plug (not shown) of a power supply cable positioned in front of the input portion 25X cannot be inserted therein due to the slide member H that has been allowed to slide. A through-hole 38A in which a screw 39 (described later) is inserted is formed in the stopper 38. Further, by movably fitting claws 37A, 37A that are provided on the respective lower faces of the top and bottom sides of the frame portion 37 in long grooves (not shown) provided in the casing 25, the slide member H is allowed to slide in a lateral direction in the drawings as shown by FIGS. 6(a), 6(b) and FIGS. 7(a) and 7(b).

A case where the cooling fan F is changed will now be described. First of all, by switching the switch W OFF by pressing the operating part 35 on the left-hand side of the switch W and removing the plug (not shown) of the power supply cable, the drive of the cooling fan F and the energization of the circuits A, B, and C is cut. Next, after the screw 39 threaded with the threaded portion 25N formed in the casing 25 has been removed, the fan cover 34 can be removed by positioning the slide member H in the removal enabling position (See FIGS. 6(b) and 7(b)) in which the fan cover 34 has been allowed to slide to the right. Once the cooling fan F has been removed from the casing 25 following removal of the fan cover 34, the cooling fan F is replaced with a new cooling fan F (See FIG. 8). Further, 40 shown in FIG. 8 are electric wires for the power supply of the cooling fan F. Then, after the cooling fan F has been replaced with the new cooling fan F and the new cooling fan F has been fitted in the casing 25, the fan cover 34 is fitted over the casing 25 so as to cover the outside of the cooling fan F. Then, after the slide member H has been positioned in the removal disabling position (See FIGS. 6(a) and 7(a)) in which the slide member H has been allowed to slide to the left side, the screw 39 is screwed into the threaded portion after passing via the through-hole 38A of the stopper 38 and then the through-hole 34A of the fan cover 34, whereby the cooling fan F and the slide member H can be fixed to the casing 25. Thereafter, the plug of the power supply cable is inserted in the input portion 25X and the switch W is turned ON, and thus the drive of the cooling fan F and the supply of power to the circuits are implemented.

Here, by performing the two operations which involve the removal of the plug of the power supply cable and turning OFF the switch W, the changing of the cooling fan F can be performed more safely, but a constitution is also possible in which the slide member H can be displaced to the removal enabling position only when the plug of the power supply cable has been removed or the switch W has been turned OFF. Further, because the switch W is constituted by a power supply ON-OFF switch for engaging the supply of power to the circuits A, B, and C, not only does this fact permit an improvement in operability enabling the supply of power to the cooling fan F to also be engaged at the same time, as well as a reduction in the number of parts due to the dual-purpose usage of the switch W, the circuits A, B, and C are compulsorily disconnected when the cooling fan F is stopped, and hence the result is a constitution that is advantageous in terms of the safety with which the cooling fan F can be changed in a state where the power supply to the circuits A, B, and C is compulsorily disconnected. However, the constitution may involve the formation of separate switches for the circuits A, B, and C and the cooling fan F rather than a single switch W.

In a state where both the cooling fan F and the fan cover 34 are not arranged in predetermined positions in the casing 25, a first stopper member 41 and second stopper member 42 for obstructing, through abutment, the movement of the slide member (protective member) H to the removal disabling position, are mounted in the casing 25 in an integrated state via a joining member 43. In addition to these stopper members 41 and 42 and the joining member 43 being integrally formed by using a composite resin or the like, same may be formed from any material as long as these members afford an elastic force.

Figure 9:
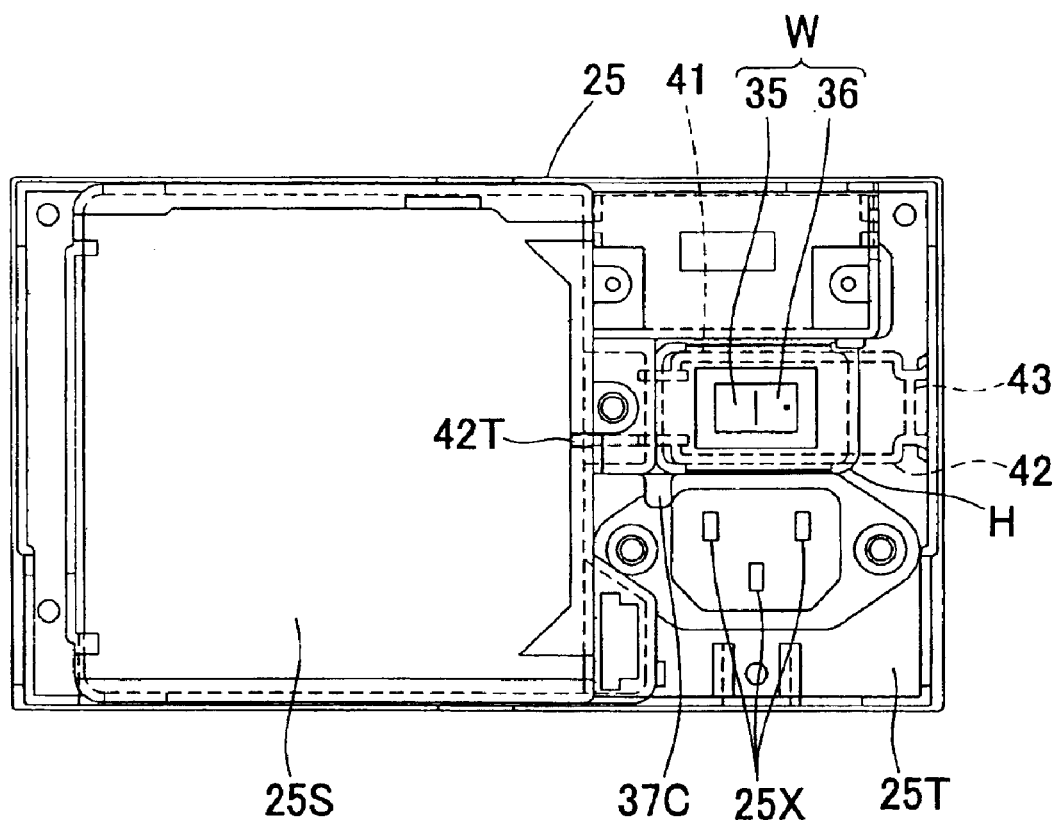
FIG. 9 is a rear view of the casing that shows a state in which the cooling fan has been removed.

Describing this in more detail, as shown in FIG. 9, in the rear face of a wall plate portion 25T located beside an opening 25S formed in the casing 25 for the disposition of the cooling fan F within the casing 25, one respective end of the pair of upper and lower stopper members 41 and 42 that are disposed in positions facing the top and bottom of the figure is fixed to an end position located on the opposite side of the opening 25S, and an idle end on the unfixed side constituting the other end of these members is provided in a state of being elastically biased toward abutment against the wall plate portion 25T. Further, the idle end 42T of the lower stopper member 42 is in a state of being positioned so as to protrude within the opening 25S, such that the stopper member 42 can be pressed into the casing 25 as a result of the cooling fan F being disposed in the casing 25. A stopper portion 42A, which abuts against the opening 25S-side end of the protrusion 37T of the slide member H that protrudes toward the wall plate portion 25T and thus obstructs the movement of the slide member H to the removal disabling position, is provided in the middle of the stopper member 42. Furthermore, a step portion (abutment portion) 41T, which is capable of pressing the stopper member 41 pressurized by the fan cover 34 into the casing 25 as a result of the fan cover 34 being disposed via the opening 25S in the same manner as the lower stopper member 42 is also provided at the idle end of the upper stopper member 41, and a stopper portion 41A, which abuts against the opening 25S-side end of the protrusion 37T of the slide member H that protrudes toward the wall plate portion 25T and thus obstructs the movement of the slide member H toward the removal disabling position, is provided.

Figure 10:
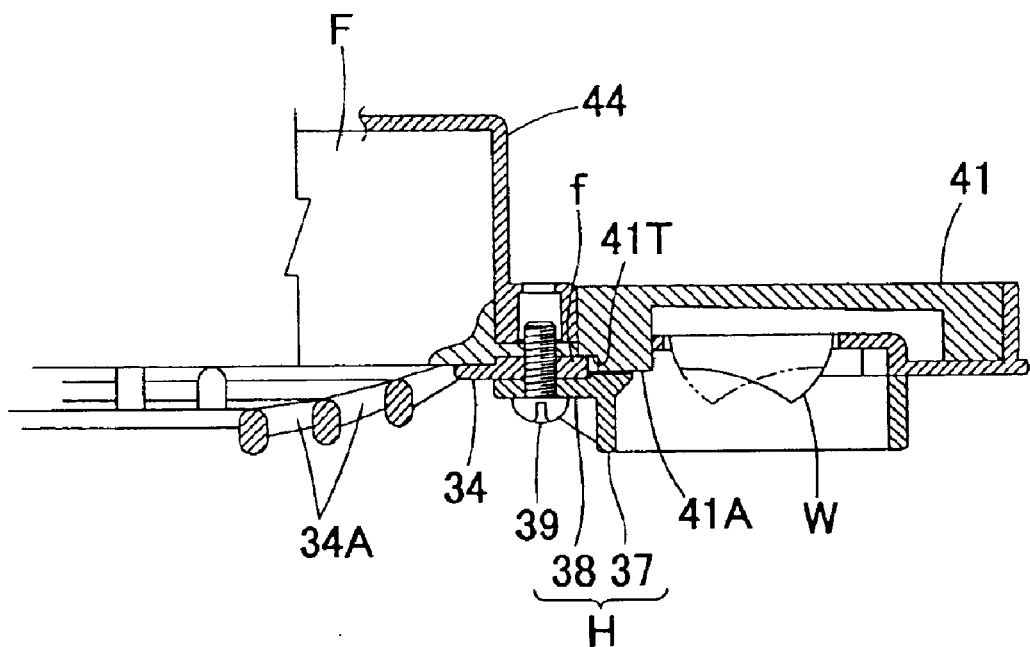
FIG. 10 is a cross-sectional view of the main parts that shows a state in which the cooling fan is attached and the protective member is fixed in the removal disabling position, where
Figure 10:
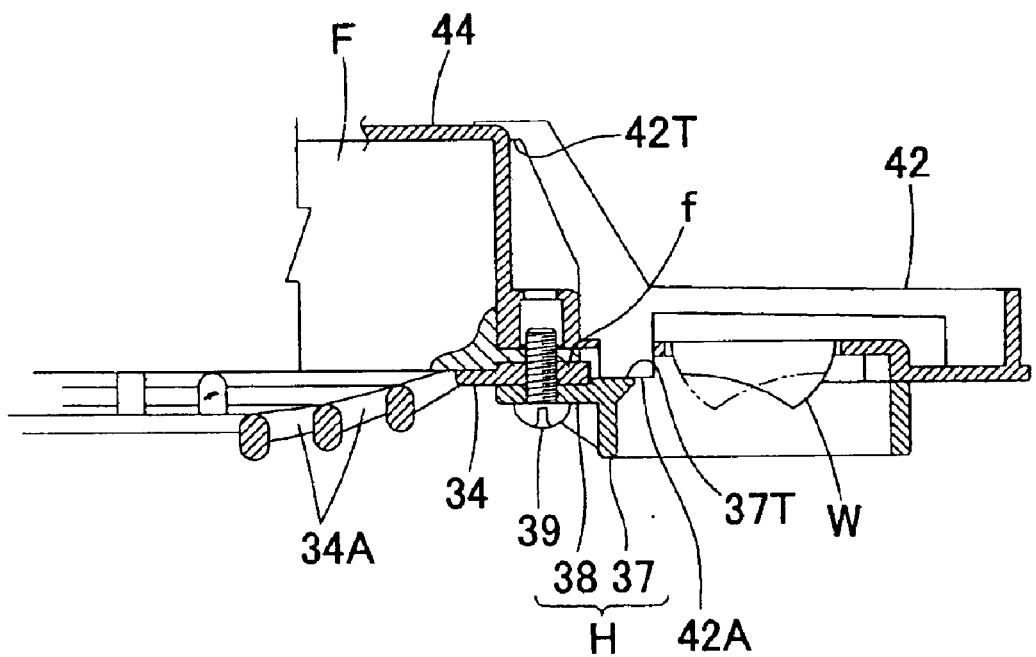
Figure 11:
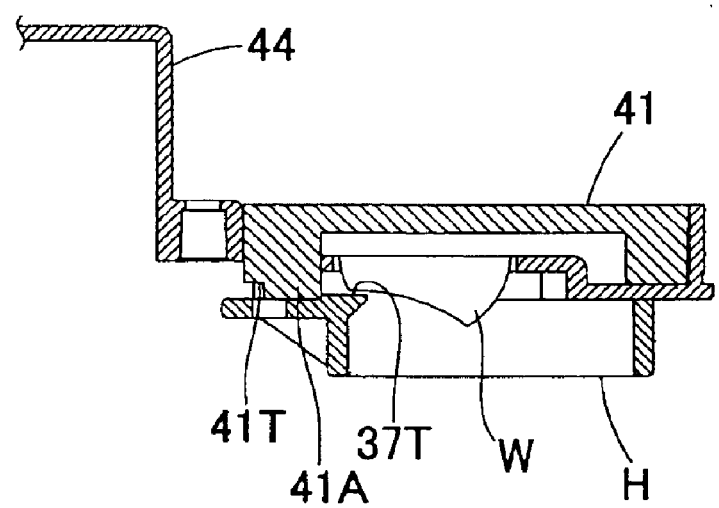
FIG. 11 provides a cross-sectional view of a state in which the protective member is slid toward the removal disabling position with the cooling fan and fan cover removed, where
Figure 11:
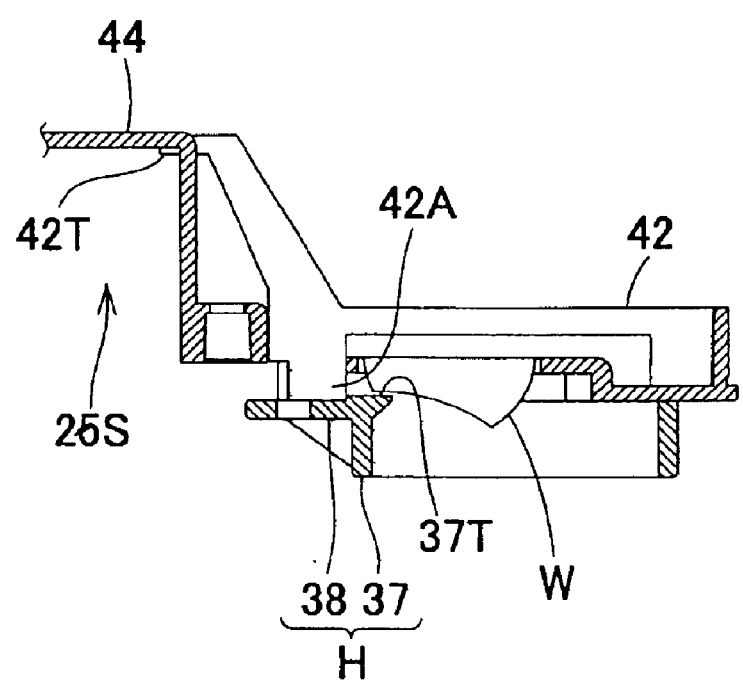

Therefore, as a result of removing the cooling fan F and the new cooling fan F striking a support member 44 contained in the casing 25 via the opening 25S therein, the idle end 42T of the stopper member 42 is pressed into the casing 25 from the position shown in FIG. 11(b) to the position shown in FIG. 10(b), and the stopper member 42 can be switched to a state allowing the slide member H to move to the removal disabling position rather than the protrusion 37T of the slide member H abutting against the stopper portion 42A as shown in FIG. 10(b). Thereafter, as a result of the fan cover 34 being disposed in front of the cooling fan F via the opening 25S, the step portion 41T of the stopper member 41 is pressed into the casing 25 from the position shown in FIG. 11(a) to the position shown in FIG. 10(a). As a result, the stopper member 42 can be switched to a state allowing the slide member H to move to the removal disabling position rather than the protrusion 37T of the slide member H abutting against the stopper portion 41A as shown in FIG. 11(a). When the slide member H is not in the removal disabling position (when the slide member H is in the removal enabling position) as shown in FIGS. 11(a) and 11(b), the switch W cannot be turned ON and the action in which the power supply is turned ON can be obstructed. 39 shown in FIGS. 10(a) and 10(b) is a screw which passes through a mounting plate portion f integrated with the cooling fan F, and the fan cover 34 so that the mounting plate portion f and the fan cover 34 are stopped by the thread of the support member 44. However, the mounting plate portion f and the fan cover 34 may be secured by means of a latch or similar. In the constitution illustrated, the stopper members 42, 41 are integral. However, two separate members may be mounted in the casing 25. Further, when the fan cover 34 is integrated with the cooling fan F, implementation involves providing only one of the stopper members 42, 41.

A multiplicity of holes 25K is formed in both end faces of the casing 25 and the auxiliary casing 26 in the direction in which the casing 25 joins the auxiliary casing 26, and an extraction fan F for extracting internal air created as a result of external air being drawn in via the holes 25K formed in one end face to the outside via the holes 25K formed in the other end face is provided in a position close to the other end face in the casing 25. Further, a multiplicity of holes 26K is formed in both end faces of the casing 25 and the auxiliary casing 26 in the direction in which the auxiliary casing 26 joins the casing 25, and the constitution is such that internal air, which is created as a result of external air being drawn in via the holes 26K formed in one end face in the auxiliary casing 26, is caused to move toward the casing 25 via the holes 26K formed in the other end face, under the intake force of the extraction fan F. As a result of this forced cooling, the internal temperature of the casings 25 and 26 can be efficiently reduced.

Because the fixing of the two casings 25 and 26 and the fixing of the two thermal radiation fins 21 and 23 is performed by means of one screw 27, there is the advantage that the number of parts is reduced and the fixing operation is rapid. However, this fixing may be performed by separate fixing means.

Figure 12:
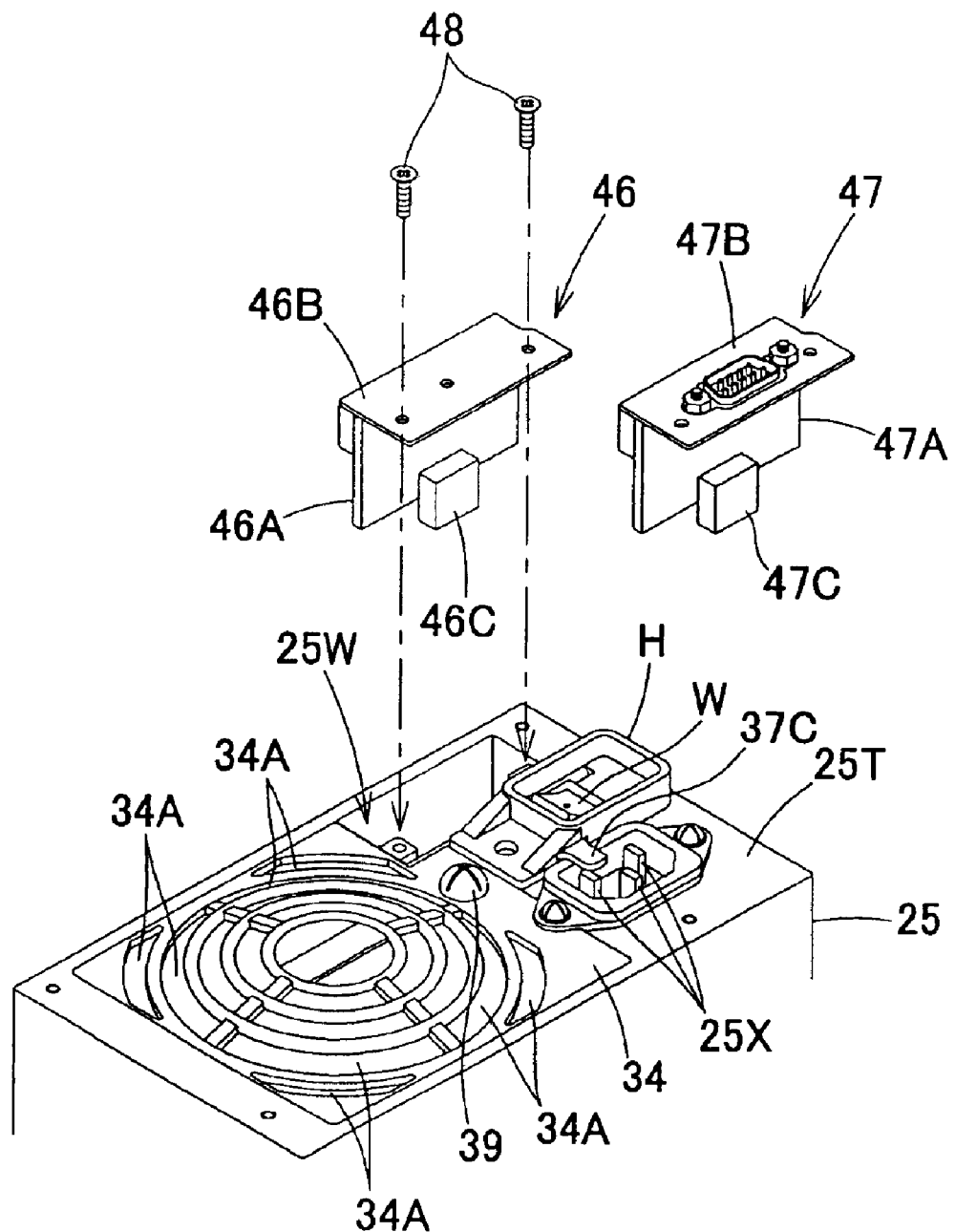
FIG. 12 is an exploded perspective view of the main parts that shows the state immediately before the various units are mounted in the casing.
Figure 13:
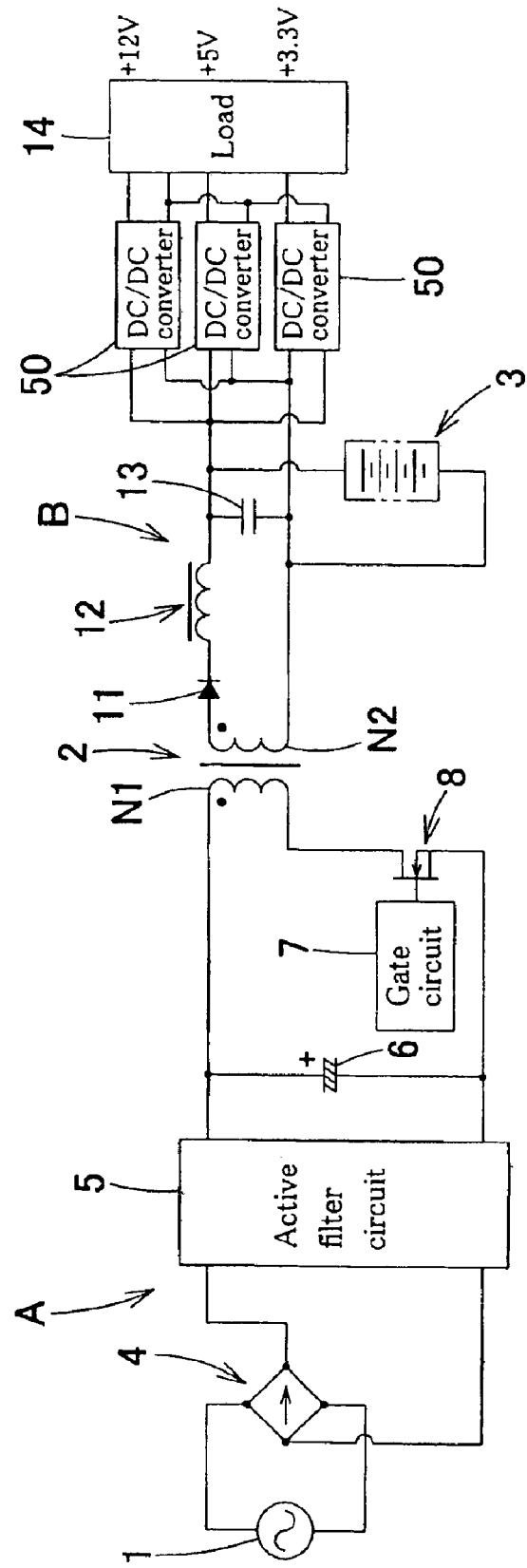
FIG. 13 is an outline block diagram showing the basic constitution of a conventional uninterruptible redundant power supply device.

As shown in FIG. 12, each unit may be constituted so as to be detachably mounted on the wall plate portion 25T of the casing 25 by using screws 48 so that various signals can be captured and processed. More specifically, a buzzer unit 46 is constituted by a signal unit printed circuit board 46A, which is fixed to a supporting plate portion 46B; and a connector 46C, which is attached to the signal unit printed circuit board 46A and permits an electrical connection to a printed circuit board (not shown) provided within the casing 25 through insertion of a unit into an opening 25W formed in the wall plate portion 25T. An RS (abbreviation for "Recommended Standard") 232C signal unit 47 is constituted by a signal unit printed circuit board 47A, which is fixed to a supporting plate portion 47B; and a connector 47C, which is attached to the signal unit printed circuit board 47A and permits an electrical connection to a printed circuit board (not shown) provided within the casing 25 through insertion of a unit into the opening 25W formed in the wall plate portion 25T. These two units 46 and 47 can be easily and rapidly switched. Further, in addition to the units 46 and 47, a USB (abbreviation for "Universal Serial Bus") signal unit can be constituted so as to be switchable as detailed above, it being possible to constitute any unit.

Because the power supply circuit and DC power supply circuit are connected in parallel with the load via a high frequency transformer, in comparison with a power supply device in which DC-DC converters and a battery and so forth are provided on a secondary side as per the prior art, it is possible to provide a power supply device that makes it possible to implement higher efficiency as well as circuit simplification and device miniaturization (a smaller footprint), and for which the constitution of a power supply device equipped with a variety of functions is advantageous from a cost perspective as well as from an assembly work standpoint, whereby a power supply device that is useful to both the user and manufacturer can be provided. Further, when the cooling fan is changed, because the party performing the work of changing the cooling fan is able to recognize that the drive of the cooling fan is completely stopped by turning OFF the cooling fan ON-OFF switch and removing the plug of the power supply cable, the work involved in changing the cooling fan can be performed rapidly with no injury concerns.

Moreover, because it is possible to avoid trouble arising from the damage to the circuit constituent parts that is caused by the heat generated by operating the power supply device when the installation of the cooling fan has been forgotten, a highly reliable power supply device can be implemented.

Because the constitution is such that the protective member is allowed to move to the removal disabling position only when the fan cover, like the cooling fan, is disposed in a predetermined position of the casing, it is possible to avoid the power supply device being operated when the installation of the fan cover has been forgotten and avoid a finger being caught in and damaged by the cooling fan during operation thereof, and hence the device is advantageous from a usage standpoint.

Because the first thermal radiation fin and the second thermal radiation fin are in a mutually thermally conductive state, the thermal radiation area can be rapidly increased and a stable power supply device that is not susceptible to adverse effects caused by heat can be implemented while an increase in the size of the device is suppressed as far as possible.

By forming air guide holes, which serve to allow air inside the auxiliary casing to be transferred to the casing by means of a single cooling fan, in the auxiliary casing and the casing, not only is it possible to compulsorily lower the inside temperature in an efficient manner, device miniaturization and cost reductions can be achieved due to the dual-purpose usage of the cooling fan.

What is claimed is:

1. A power supply device, wherein:

a power supply circuit, which comprises a rectifier circuit for rectifying an AC current from a commercial AC power supply and a switching element provided on the output side of the rectifier circuit, is connected to a first primary side winding of a high frequency transformer;

a secondary side DC output circuit, which supplies electric power to a load, is connected to a secondary side winding of the high frequency transformer;

a second primary side winding of the high frequency transformer and a DC power supply circuit that is separate from the power supply circuit are provided with connecting portions that are capable of connecting and disconnecting the second primary side winding and the DC power supply circuit;

a cooling fan for the release to the outside of heat generated within a casing that houses at least the power supply circuit, the first primary side winding, the secondary side DC output circuit, the secondary side winding, and the second primary side winding is detachably mounted in the casing;

a protective member is mounted so as to be displaceable to a removal disabling position located in front of the cooling fan in order to obstruct removal of the cooling fan by abutting against same, and to a removal enabling position that is retracted from the position in front of the cooling fan in order to allow removal of the cooling fan;

the protective member is constituted so as to be displaceable to the removal enabling position only when a switch provided on the casing is turned OFF in order to switch the cooling fan from ON to OFF, or only when an insertable/removable power supply cable plug that is inserted in an input portion provided in the casing in order to input the AC current from the commercial AC power supply is removed, or only when the switch is turned OFF and the plug is removed;

a stopper member, which obstructs the movement of the protective member to the removal disabling position by abutting against the protective member in a state where the cooling fan is not disposed in a predetermined position in the casing, and which allows the movement of the protective member to the removal disabling position in a state where the cooling fan is disposed in the predetermined position in the casing, is provided.

2. The power supply device according to claim 1, wherein:
   a fan cover for covering the cooling fan is detachably provided in the casing, in front of the cooling fan; and
   a second stopper member, which serves to obstruct the movement of the protective member to the removal disabling position by abutting against the protective member in a state where the fan cover is not disposed in a predetermined position of the casing, and which serves to allow the movement of the protective member to the removal disabling position in a state where the cooling fan is disposed in a predetermined position in the casing, is provided.

3. The power supply device according to claim 1 or 2, further comprising:
   a first thermal radiation fin for releasing heat generated by circuit constituent parts of the power supply circuit and the secondary side DC output circuit; and
   a second thermal radiation fin for releasing heat generated by circuit constituent parts of the DC power supply circuit,
   wherein the two thermal radiation fins are brought into a thermally conductive state by being made to contact each other.

4. The power supply device according to claim 1, wherein the DC power supply circuit comprises a switching element that is in sync with a switching element of the power supply circuit or that is operated in accordance with the operating states of the power supply circuit.

5. The power supply device according to claim 1, wherein:
   an AC drive unit is constituted by the power supply circuit, the first primary side winding, the secondary side DC output circuit, the secondary side winding, the second primary side winding, and the first thermal radiation fin;
   the AC drive unit is housed in the casing;
   a DC power supply circuit unit is constituted by the DC power supply circuit and the second thermal radiation fin;
   the DC power supply circuit unit is housed in an auxiliary casing that is different from the casing; and
   air guide holes, which serve to allow air inside the auxiliary casing to be transferred to the casing by means of the cooling fan, are formed in the auxiliary casing and the casing.

6. The power supply device according to claim 1, wherein the circuit constituent parts are a diode and the switching element.

* * * * *